(12) United States Patent
Dang et al.

(10) Patent No.: US 7,437,635 B1
(45) Date of Patent: Oct. 14, 2008

(54) TESTING HARD-WIRED IP INTERFACE SIGNALS USING A SOFT SCAN CHAIN

(75) Inventors: Danh Dang, Hayward, CA (US); Chung Elvis Fu, Sunnyvale, CA (US); Michael Harms, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 548 days.

(21) Appl. No.: 10/750,175

(22) Filed: Dec. 30, 2003

(51) Int. Cl.
G01R 31/28 (2006.01)

(52) U.S. Cl. .................. 714/726; 714/725; 714/724; 714/727; 714/729; 714/742; 714/30; 714/734; 326/38; 326/40; 326/41

(58) Field of Classification Search .............. None
See application file for complete search history.

(56) References Cited

U.S. PATENT DOCUMENTS

| | | | |
|---|---|---|---|
| 5,003,204 A * | 3/1991 | Cushing et al. ............ 326/40 |
| 5,550,843 A * | 8/1996 | Yee ........................... 714/726 |
| 5,592,493 A * | 1/1997 | Crouch et al. ............. 714/729 |
| 5,651,013 A * | 7/1997 | Iadanza ...................... 714/731 |
| 5,675,589 A * | 10/1997 | Yee ........................... 714/30 |
| 5,719,878 A * | 2/1998 | Yu et al. .................... 714/726 |
| 6,114,892 A * | 9/2000 | Jin ............................ 327/202 |
| 6,243,304 B1 * | 6/2001 | Patel et al. ............ 365/189.08 |
| 6,331,790 B1 * | 12/2001 | Or-Bach et al. ........... 326/41 |
| 6,374,380 B1 * | 4/2002 | Sim .......................... 714/727 |
| 6,412,098 B1 * | 6/2002 | Jin ............................ 716/4 |
| 6,842,039 B1 * | 1/2005 | Guzman et al. ........... 326/38 |
| 6,968,487 B1 * | 11/2005 | Bryant et al. ............. 714/726 |
| 6,972,592 B2 * | 12/2005 | Benware ................... 326/38 |
| 6,983,405 B1 * | 1/2006 | Herron et al. ............. 714/726 |
| 6,996,758 B1 * | 2/2006 | Herron et al. ............. 714/726 |
| 7,058,867 B2 * | 6/2006 | Suzumura .................. 714/726 |
| 2004/0081208 A1 * | 4/2004 | Tseng ....................... 370/532 |
| 2005/0138509 A1 * | 6/2005 | Kiryu et al. ............... 714/726 |

OTHER PUBLICATIONS

Renovell et al., "IS-FPGA: A New Symmetric FPGA Architecture with Implicit SCAN", Nov. 1, 2001, IEEE International Test Conference 2001, pp. 924-931.*

* cited by examiner

Primary Examiner—John P Trimmings
(74) Attorney, Agent, or Firm—Townsend and Townsend and Crew LLP (57) ABSTRACT

A set of boundary scan registers are implemented by reconfiguring the functional blocks of a reconfigurable device. This "soft-wired" set of boundary scan registers can be used to test the interface connections between the IP core and the functional blocks of the reconfigurable device. Additionally, the set of boundary scan registers only exists when a testing configuration is loaded into the reconfigurable device. When testing is complete, the testing configuration is erased and the functional blocks may implement other operations. Thus, the set of boundary scan registers consumes no additional chip area. Furthermore, as the set of boundary scan registers disappears after testing, a functional path enabling normal operation modes is unnecessary. Therefore, manually created functional test data is not needed. Instead, ATPG software can create test data from hardware descriptions of the IP core and the set of boundary scan registers.

20 Claims, 6 Drawing Sheets

TESTING HARD-WIRED IP INTERFACE SIGNALS USING A SOFT SCAN CHAIN

BACKGROUND OF THE INVENTION

The present invention relates generally to the field of reconfigurable devices. Reconfigurable devices, such as programmable logic devices (PLDs), are used to implement a desired circuit design. A PLD is typically composed of a number of functional blocks that use either a combination of logic gates or look-up tables to implement a general-purpose logic operation. The logic operation of each functional block can be defined to implement a portion of the desired circuit design. The functional blocks are interconnected with a configurable switching circuit. The configurable switching circuit selectively establishes connections between the functional blocks, enabling the PLD to perform the functions of the desired circuit design. The configurable switching circuit also establishes connections between some of the functional blocks and the pins of the PLD, so that data can be input to and output from the PLD. Configuration information determines the function of the configurable switching circuit and the functional blocks. The configuration information may be loaded into the PLD or other reconfigurable device from a separate configuration device.

In addition to functional blocks adapted to implement a variety of general-purpose logic operations, reconfigurable devices can include specialized components used to implement specific functions. These specialized components, referred to as intellectual property or IP cores, are specifically adapted to their intended functions. Example IP cores include memory devices, signal processing devices, phase-locked loop devices, and high-speed serial communication devices, which can be used to implement a variety of serial communication standards, such as SerialLite, Ethernet and Gigabit Ethernet, Fibrechannel, PCI-X, and Infiniband. A reconfigurable device may include several IP cores, each used to perform a different specialized function.

Testing reconfigurable devices having both general functional blocks and specialized IP cores presents numerous challenges. Both the functional blocks and the IP cores need to be tested. In addition, the connections interfacing the IP cores and the other portions of the reconfigurable device, for example function blocks, also need to be tested. To test the interface between the IP cores and functional blocks, one prior approach uses a set of functional test data to test the operation of the IP core for all possible input and output signals. However, this functional testing requires manual creation of the entire set of test data by engineers with detailed understanding of the operation of the IP core. This introduces the possibility of creating faulty test data. Additionally, small modifications to the IP core require a new set of test data to be created. Furthermore, complex IP cores may have hundreds of interface connections, making the manual creation of test data a difficult and time-consuming process.

Another prior approach to testing interface connections between hard-wired IP and functional blocks of a reconfigurable device includes a set of boundary scan registers on the reconfigurable device to input test data to the IP core and to capture outputs from the IP core. The test data for the interface connections between the boundary scan registers and the IP core can be created using automated test program generation (ATPG) software, greatly simplifying the creation of test data. However, a set of functional test data is still needed to validate the functional path portions of the interface connections that bypass the boundary scan registers. This set of functional test data must be created manually, with all of the disadvantages discussed above. Additionally, the set of boundary scan registers takes up space on the reconfigurable device that could otherwise be devoted to different features.

It is therefore desirable for a system and method of testing interface connections between IP cores and functional blocks on a reconfigurable device enable complete testing without the need for manually-created sets of functional test data. It is further desirable that a system and method of testing interface connection does not require additional devices, such as boundary scan registers, to be included in the reconfigurable device.

BRIEF SUMMARY OF THE INVENTION

An embodiment of the invention implements a set of boundary scan registers by reconfiguring the functional blocks of a reconfigurable device. This "soft-wired" set of boundary scan registers can be used to test the interface connections between the IP core and the functional blocks of the reconfigurable device. Additionally, the set of boundary scan registers only exists when a testing configuration is loaded into the reconfigurable device. When testing is complete, the testing configuration is erased and the functional blocks may implement other operations. Thus, the set of boundary scan registers consumes no additional chip area. Furthermore, as the set of boundary scan registers disappears after testing, a functional path enabling normal operation modes is unnecessary. Therefore, manually created functional test data is not needed to test the functional path. Instead, ATPG software can create test data from hardware descriptions of the IP core and the set of boundary scan registers.

In an embodiment, a method for testing a set of interface connections between an IP core implementing at least one specialized operation and a set of functional blocks adapted to implement general-purpose logic devices includes creating a test program. The test program includes a set of test data and a test configuration. The test configuration is adapted to configure the set of functional blocks to implement a set of boundary scan registers connected with the interface connections of the IP core. The method further includes configuring the reconfigurable device according to the test configuration. The method inputs the test data into the reconfigurable device to create a set of test results, and analyzes the set of test results to determine the integrity of the set of interface connections.

In an additional embodiment, the set of boundary scan registers includes a plurality of shift registers connected in series. Each shift register is adapted to be connected with an interface connection of the IP core. In a further embodiment, a first portion of the plurality of shift registers is adapted to be connected with a set of input interface connections of the IP core and a second portion of the plurality of shift registers is adapted to be connected with a set of output interface connections of the IP core.

In another embodiment, the test configuration is defined with a hardware description language representation. The hardware description language representation of the test configuration is combined with a hardware description language representation of the IP core to form a test hardware description. The test hardware description is analyzed to create a set of test data. In yet a further embodiment, the test hardware description and the set of test data are analyzed to create a set of expected test results. The test results are then analyzed by comparing the set of test results with the set of expected test results.

BRIEF DESCRIPTION OF THE DRAWINGS

The invention will be described with reference to the drawings, in which.

DETAILED DESCRIPTION OF THE INVENTION

Figure 1:
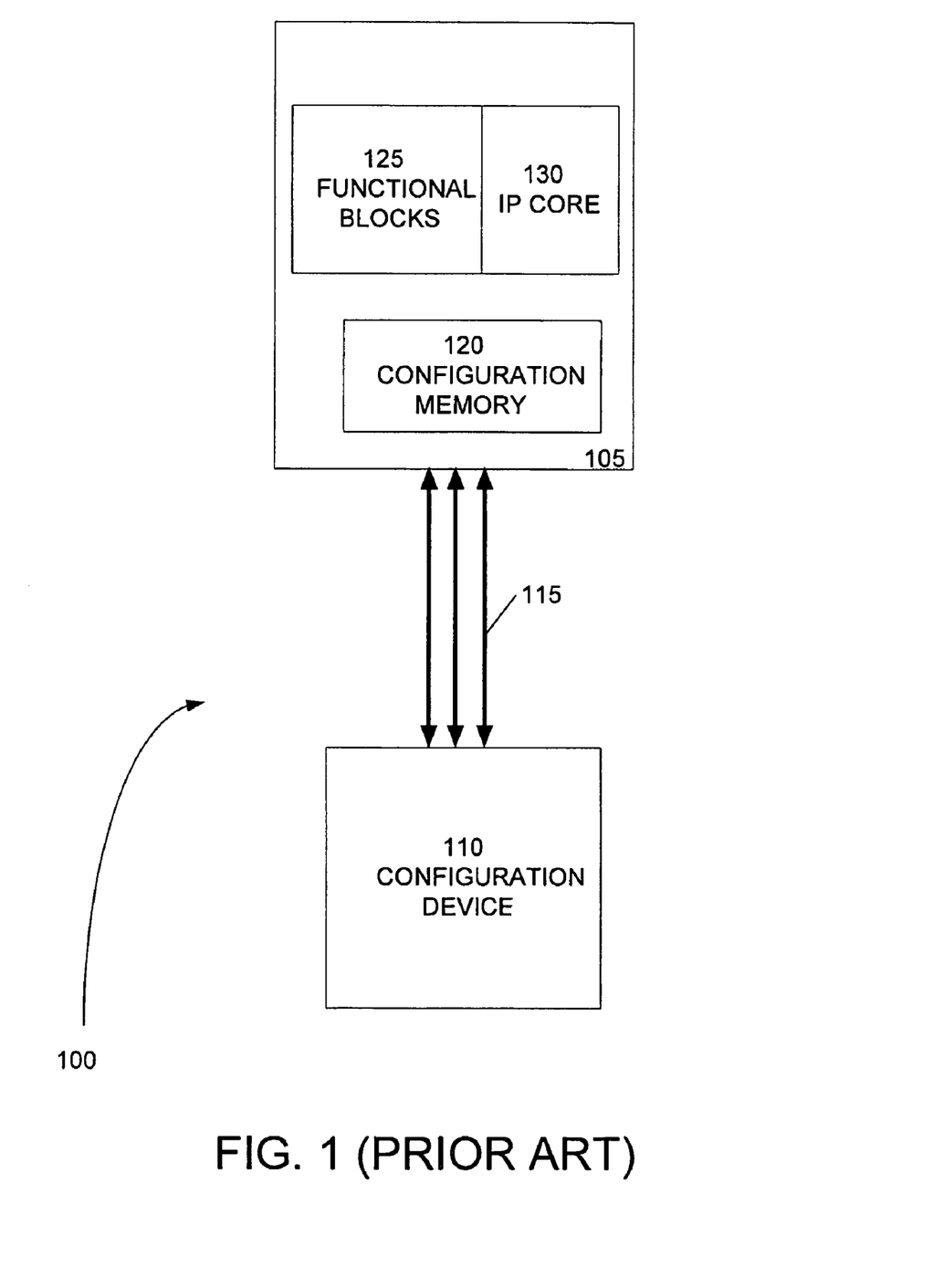
FIG. 1 illustrates a system having an example reconfigurable device suitable for the application of the present invention.

FIG. 1 illustrates a system having an example reconfigurable device suitable for the application of the present invention. FIG. 1 illustrates a system 100 with a reconfigurable device 105. An example of a reconfigurable device is a programmable logic device (PLD). A PLD is typically composed of a number of functional blocks 125 that use either a combination of logic gates or a look-up table to perform general-purpose logic operations. In addition to functional blocks 125, reconfigurable device 105 includes one or more IP cores 130. The IP cores 130 are adapted to perform specialized operations. The reconfigurable device 105 can be configured according to configuration information to perform different functions. The configuration information for the reconfigurable device is stored in a configuration memory 120.

A configuration device 110 is connected with the reconfigurable device 105. The configuration device 110 contains a copy of the configuration information for the reconfigurable device 105. The configuration information can be stored in a non-volatile memory in the configuration device 110. The configuration device 110 is connected with the reconfigurable device through configuration connection 115. The configuration device 110 is adapted to load the configuration information into the reconfigurable device 105 through configuration connection 115 upon receiving a request from the reconfigurable device 105. This loading process is typically a sequence of events for sending configuration information to the reconfigurable device 105 and verifying that the configuration information was received and loaded correctly. Although shown in FIG. 1 as a single device, the configuration device 110 can be a general-purpose processor coupled with an integrated or separate memory device. Alternatively, the configuration device 110 can be a memory device specifically adapted to communicate configuration information with a reconfigurable device 105.

Figure 2A:
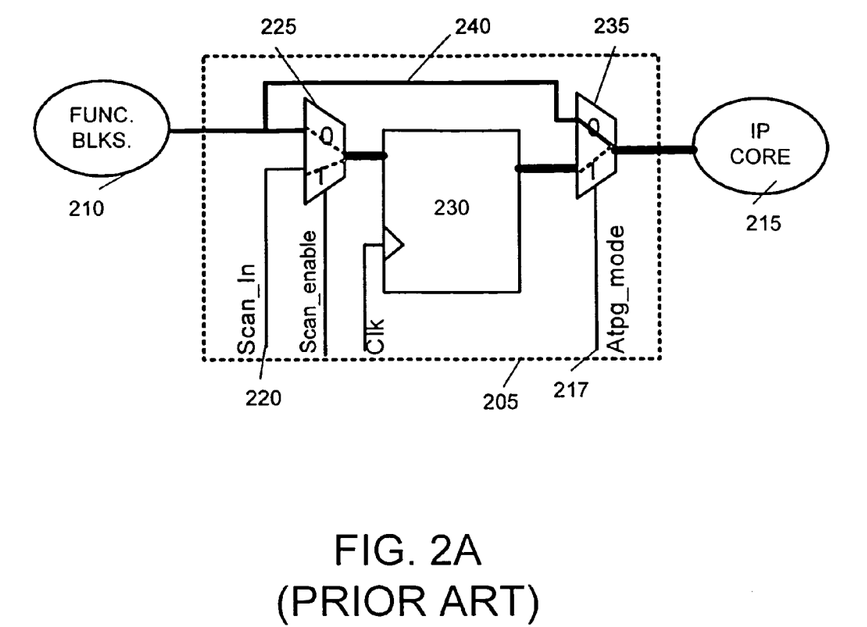
FIGS. 2A and 2B illustrate example input and output boundary scan registers used in prior testing approaches.

FIGS. 2A and 2B illustrate example input and output boundary scan registers used in prior testing approaches. FIG. 2A illustrates an input boundary scan register 205 used for testing inputs to the IP core 215. During normal operation, input data travels from functional blocks 210 to the IP core 215 via functional path 240. An ATPG testing mode is activated by line 217. When line 217 is asserted, a test data value is loaded from line 220 into flip-flop 230 through multiplexer 225. The output of flip-flop 230 is then passed through multiplexer 235 to the IP core 215. In this manner, test data values can be sent directly to the IP core 215.

Figure 2B:
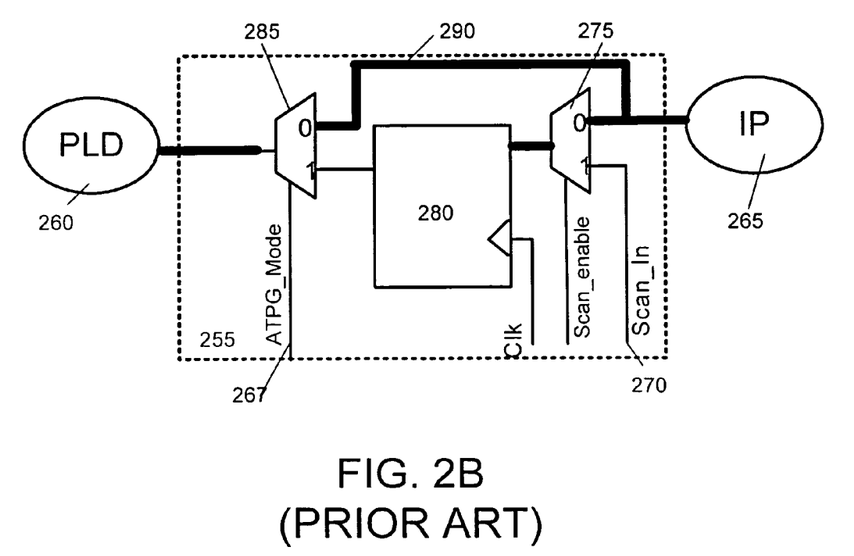

Similarly, FIG. 2B illustrates an output boundary scan register 255 used for testing outputs from the IP core 265. During normal operation, output data travels to functional blocks 260 from the IP core 265 via functional path 290. An ATPG testing mode is activated by line 267. When line 267 is asserted, a test data value is loaded from line 270 into flip-flop 280 through multiplexer 275. The output of flip-flop 280 is then passed through multiplexer 285 to the functional blocks 260. In this manner, test data values can be sent directly to the functional blocks 260.

The set of test data used with boundary scan registers such as registers 205 and 255 can be created automatically using ATPG software. However, the set of test data cannot completely test the interface connections between the functional blocks and the IP core. For example, input boundary scan register 205 can only test the integrity of the connection from the output of flip-flop 230 through multiplexer 235 to IP core 215. The input boundary scan register 205 cannot test the integrity of the connection between functional blocks 210 along functional path 240 to multiplexer 235. Similarly, output boundary scan register 255 cannot test the integrity of the connection from IP core 265 along functional path 290 to multiplexer 285. Instead, functional tests must be manually created to test the integrity of the functional paths 240 and 290. Additionally, there is typically a boundary scan register for each interface connection with the IP core. Because there are often hundreds of interface connections for a single IP core, the set of boundary scan registers wastes a large amount of chip area.

An embodiment of the invention replaces the dedicated set of boundary scan registers with a set of boundary scan registers implemented using the functional blocks of the reconfigurable device. This set of "soft" boundary scan registers only exists when a special testing configuration is loaded into the reconfigurable device. When testing is complete, this configuration is erased and the functional blocks used to implement the set of soft boundary scan registers can be used for other purposes. Thus, the set of soft boundary scan registers consume no additional chip area. Moreover, as discussed below, the set of soft boundary scan registers can completely test the IP core interface connections using test data created automatically using ATPG software, significantly decreasing the amount of engineering resources needed to develop test data.

Figure 3:
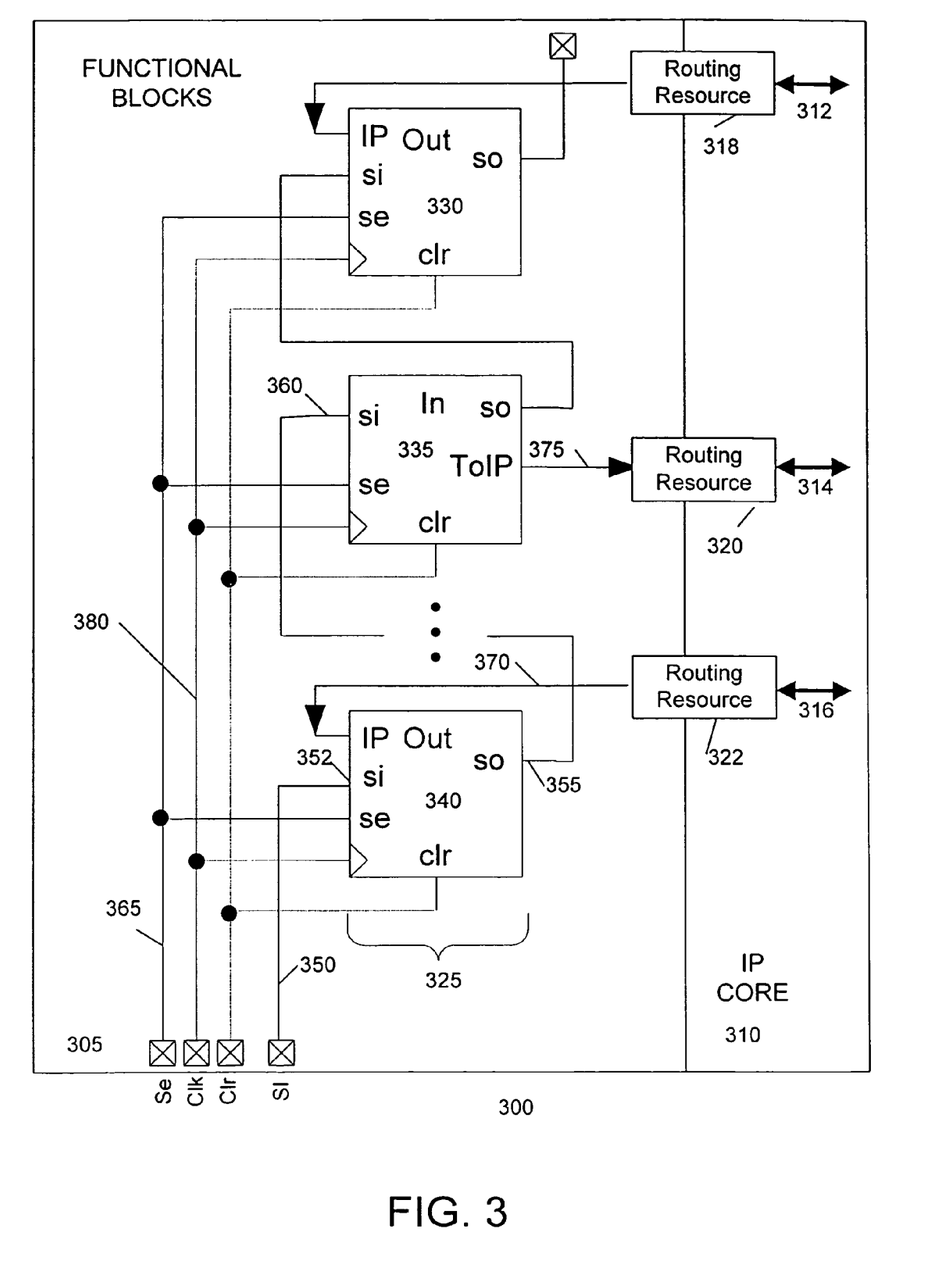
FIG. 3 illustrates a set of soft boundary scan registers according to an embodiment of the invention.

FIG. 3 illustrates a set of soft boundary scan registers according to an embodiment of the invention. A reconfigurable device 300 includes general-purpose functional blocks 305 and a specialized IP core 310. Interface connections 312, 314, and 316 connect inputs and outputs of the IP core 310 with corresponding routing resources 318, 320, and 322. Routing resources 318, 320, and 322 connect interface connections with the configurable switching circuit of the reconfigurable device 300, enabling the interface connections to be connected with any portion of the configurable device 300.

At least a portion of the functional blocks 305 of configurable device 300 are configured to form a set of soft boundary scan registers 325. The set of soft boundary scan registers 325 include input boundary scan register 335 and output boundary scan registers 330 and 340.

Although implemented using the functional blocks 305 of the reconfigurable device 300, the set of soft boundary scan registers 325 behave similarly to their hard-wired counterparts discussed in FIGS. 2A and 2B. In an embodiment, the set of soft boundary scan registers 325 function as a parallel-load, serial shift register. In this embodiment, test data is inputted in parallel from the input boundary scan registers to the IP core and loaded in parallel from the IP core to output boundary scan registers. Test data is serially loaded into the reconfiguration device 300 and shifted within the set of soft boundary scan registers to the appropriate position.

For example, test data values loaded into the reconfigurable device 300 via serial input line 350. Test data values are passed by register 340 from serial input 352 to serial output 355. Serial output 355 is connected with the serial input 360 of adjacent boundary scan register 335, thereby passing successive test data values from register 340 to register 335 and beyond to the other registers in the set of soft boundary scan registers 325.

Once a complete set of test data values has been loaded into the set of soft boundary scan registers 325, a shift-enable line 365 is asserted low and the values of each of the input boundary scan registers in the set of soft boundary scan register 325 is input into the IP core 310 via the associated interface connections. Additionally, the outputs of the IP core 310 are captured by the output boundary scan registers in the set of soft boundary scan registers 325 when the scan clock 380 is toggled while the shift-enable line 365 is still asserted low. The captured outputs of the IP core 310 can then be serially shifted out of the set of soft boundary scan registers 325 and analyzed to determine the integrity of the interface connections.

Figure 4A:
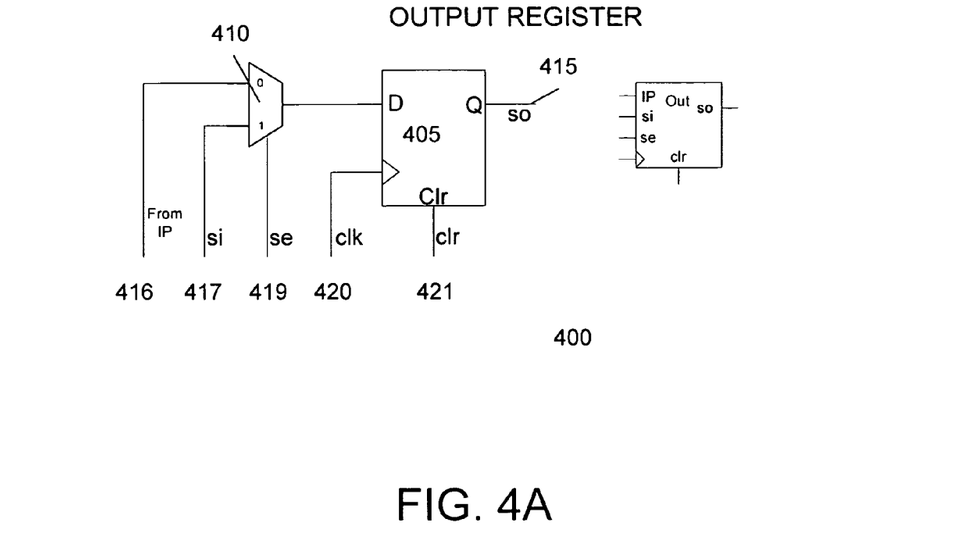
FIGS. 4A and 4B illustrate example implementations of input and output registers for a set of soft boundary scan registers according to an embodiment of the invention.

FIGS. 4A and 4B illustrate example implementations of input and output registers for a set of soft boundary scan registers according to an embodiment of the invention. FIG. 4A illustrates an example implementation of an output boundary scan register 400. Output boundary scan register 400 includes a flip-flop 405. A multiplexer 410 alternately selects either serial output 417 from an adjacent boundary scan register or an output 416 from the IP core to be loaded into flip-flop 405. The multiplexer 410 is controlled be serial enable line 419. The output 415 of flip-flop 405 can be connected to the serial input of an adjacent boundary scan register. Flip-flop 405 also includes clock 420 and clear inputs 421 used for controlling and initializing the output boundary scan register 400.

Figure 4B:
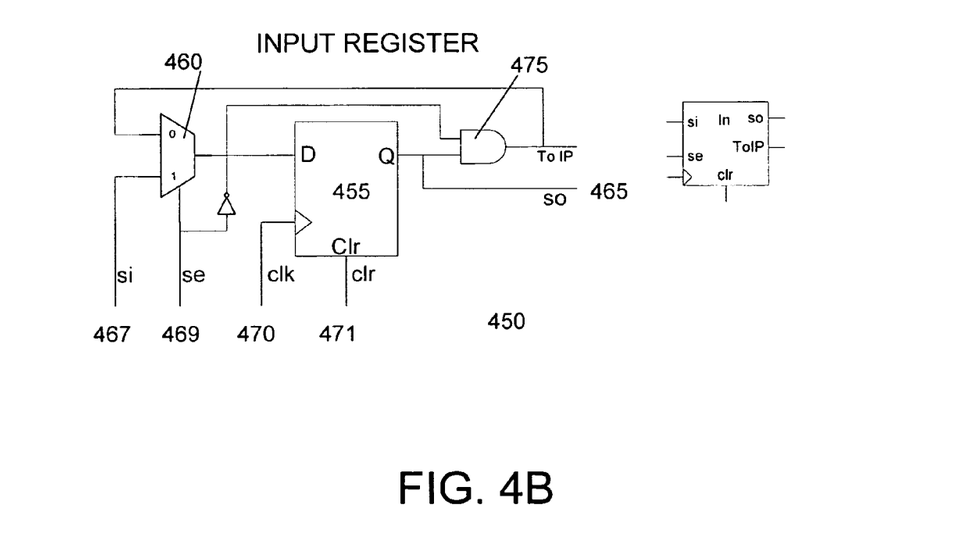

Similarly, FIG. 4B illustrates an example implementation of an input boundary scan register 450. Input boundary scan register 450 includes a flip-flop 455. A multiplexer 460 alternately selects either serial output 467 from an adjacent boundary scan register or the output 465 of flip-flop 455 to be loaded into flip-flop 455. The multiplexer 460 is controlled be serial enable line 469. The output 465 of flip-flop 455 is connected to the serial input of an adjacent boundary scan register. Additionally, the output 465 of flip-flop 455 is connected through AND gate 475 to the IP core, such that when the serial enable line 469 is asserted low, the test data stored by flip-flop 455 is input into the IP core. Flip-flop 455 also includes clock 470 and clear inputs 471 used for controlling and initializing the input boundary scan register 450.

Unlike the hard-wire versions of boundary scan registers discussed in FIGS. 2A and 2B, soft boundary scan registers 400 and 450 do not have a functional path to be used in normal operation. Instead, testing mode is "activated" by configuring general-purpose functional blocks to create a set of soft boundary scan registers. When testing is complete, the configuration is erased and a new configuration connecting functional blocks with the IP core is loaded. Because there are no functional paths, there is no need to manually create functional test data to validate the functional paths.

In a further embodiment, the set of soft boundary scan registers are defined using a hardware description language. This allows the same software programs used for developing and testing user configurations and the IP core to also be used to test interface connections between the IP core and functional blocks. Tables 1 and 2 illustrate example Verilog definitions of input and output boundary scan registers, similar to implementations 400 and 450.

TABLE 1

Example Verilog Description of an Output Boundary Scan Register

```
module hssi2pld ( clk, clr, se, si, pi, so );
    input    clk;      // clk
    input    si;       // Scan In
    input    se;       // Scan Enable
    input    clr;      // clr
    input    pi;       // From IP
    output   so;       // Scan Out
    wire     se_n;
    wire     nand1_out;
    wire     nand2_out;
    wire     mux_out;
    wire     so;
    not not1 (se_n,se);
    nand nand1 (nand1_out,pi,se_n);
    nand nand2(nand2_out,si,se);
    nand nand3 (mux_out,nand1_out,nand2_out);
    D_REGISTER REGISTER1 ( so,mux_out,clk,clr);
endmodule
```

TABLE 2

Example Verilog Description of an Input Boundary Scan Register

```
module pld2hssi ( clk, clr, se, si, so, po );
    input    clk;      // clk
    input    si;       // Scan In
    input    se;       // Scan Enable
    input    clr;      // clear
    output   so;       // Scan Out
    output   po;       // To IP
    wire     po;
    wire     se_n;
    wire     nand1_out;
    wire     nand2_out;
    wire     mux_out;
    wire     so;
    not not1 (se_n,se);
    nand nand1 (nand1_out,po,se_n);
    nand nand2(nand2_out,si,se);
    nand nand3 (mux_out,nand1_out,nand2_out);
    D_REGISTER REGISTER1 ( so,mux_out,clk,clr);
    nand nand4 (po,se_n,so);
endmodule
```

Figure 5:
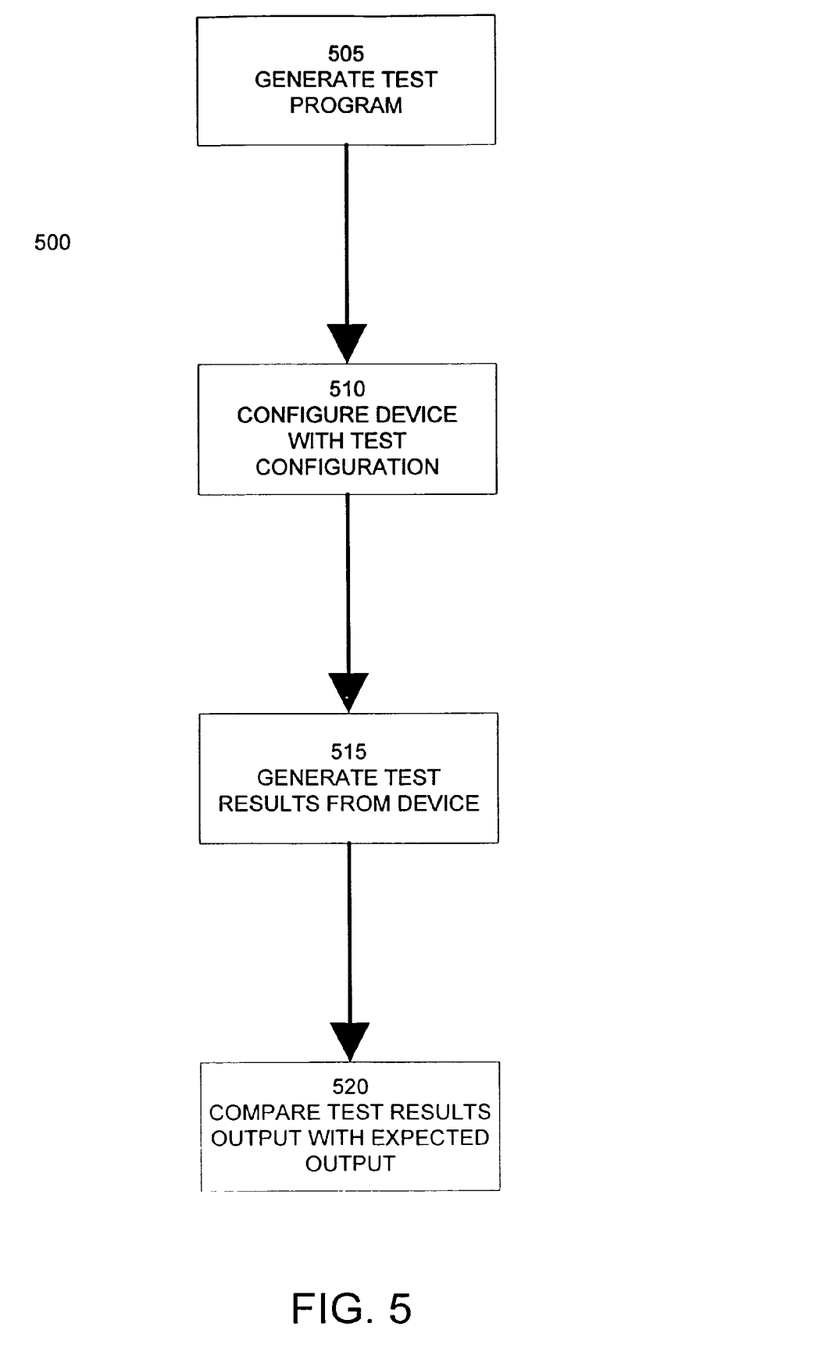
FIG. 5 illustrates a flowchart of a method for testing interface connections between IP cores and functional blocks according to an embodiment of the invention.

FIG. 5 illustrates a flowchart 500 of a method for testing interface connections between IP cores and functional blocks according to an embodiment of the invention. At step 505, a test program is created for the interface connections between one or more IP cores and the functional blocks of a reconfigurable device. In an embodiment, a set of soft boundary scan registers is defined for each interface connection of the IP core. In an embodiment, each register of the set of soft boundary scan registers is defined as either an input register or an output register as discussed above. The input and output registers are connected with serial inputs and outputs to form one or more chains of registers enabling test data to be loaded into and read out of the reconfigurable device.

In a further embodiment, the set of soft boundary scan registers is used in two different ways to create the test program. First, a hardware description language representation of the set of boundary scan registers is combined with a hardware description language representation of the IP core to form a test hardware description. The test hardware description is processed by ATPG software to produce a set of data, including test inputs and test outputs, adapted to determine the integrity of the interface connections. Yet a further embodiment also produces a set of test data for testing the operation of the IP core as well.

Second, the hardware description language representation of the set of boundary scan registers is processed by logic synthesis, extraction, routing, and assembly software to create a test configuration for the functional blocks of the reconfigurable device. Together, the test configuration for the functional blocks of the reconfigurable device and the set of test inputs and test output form a test program for testing interface connections between one or more IP cores and the functional blocks of a reconfigurable device.

At step 510, a reconfigurable device is configured with the test configuration defining the set of soft boundary scan registers. The test configuration is loaded into the reconfigurable device to implement the set of soft boundary scan registers. In an embodiment, the test configuration may be converted to a data format used by a test system prior to being loaded into the reconfigurable device.

At step 515, the test data is processed by the reconfigurable device to create a set of test results. In an embodiment, a testing system serially loads test inputs into set of soft boundary scan registers of the reconfigurable device. The test inputs are then input into the IP core to produce a portion of the set of test results. The test results are captured by the set of soft boundary scan registers and serially output from the reconfigurable device to the test system. This is repeated until the entire set of test inputs has been processed by the IP core, producing a complete set of test results.

At step 520, the test results are compared with their expected values to determine the integrity of the interface connections and optionally validate the operation of the IP core. As discussed above, an embodiment of the invention uses ATPG software to generate a set of test data outputs defining the expected output of the IP core for each set of test data inputs.

Figure 6:
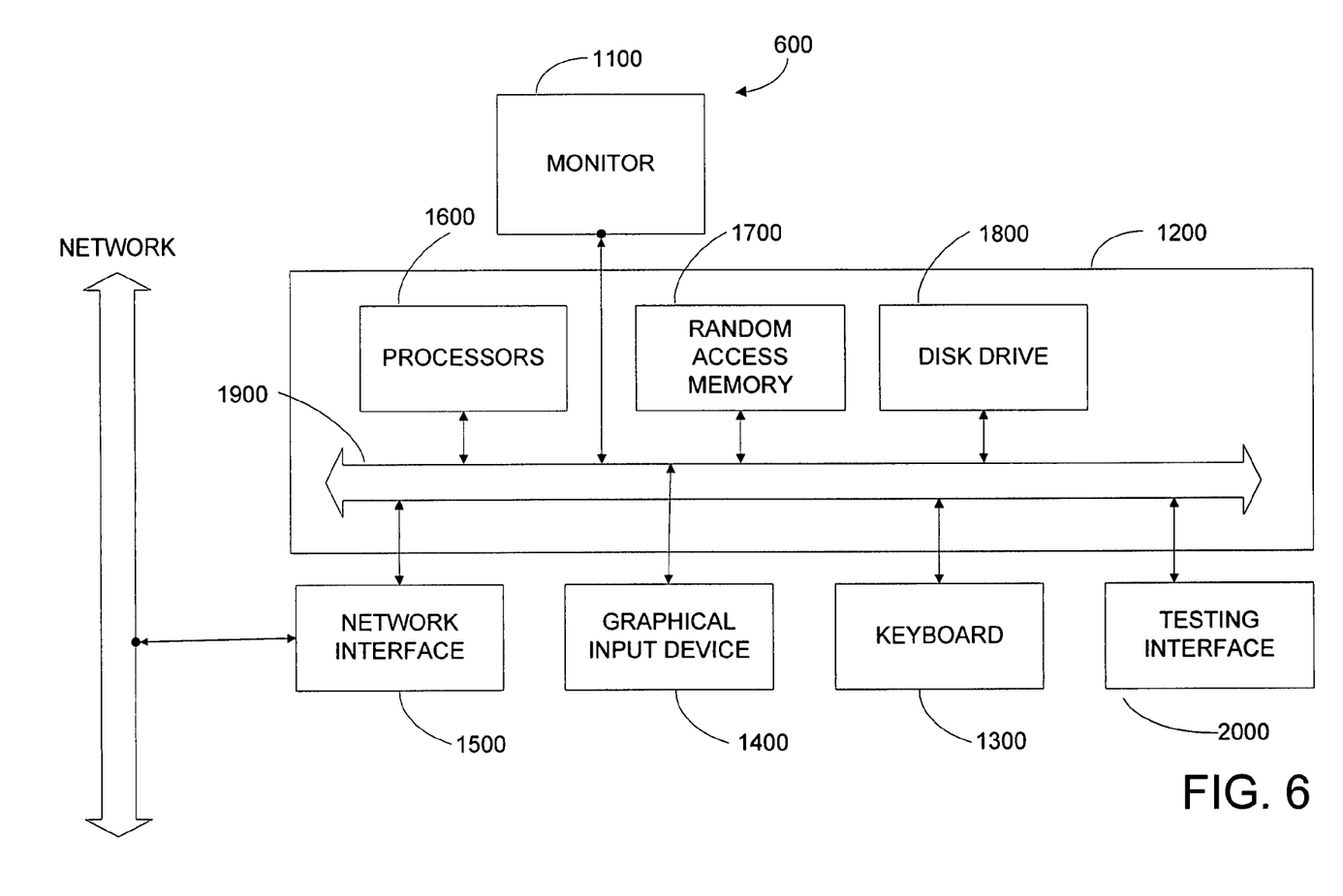
FIG. 6 illustrates an example computer system suitable for use in testing interface connections between IP cores and functional blocks according to an embodiment of the invention.

FIG. 6 illustrates an example computer system 600 suitable for use in testing interface connections between IP cores and functional blocks according to an embodiment of the invention. Computer system 600 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN). Computer system 600 also includes testing interface 2000 adapted to communicate with reconfigurable devices, such as programmable logic devices (PLDs). Testing interface 2000 includes functions for loading configuration data into one or more reconfigurable devices, inputting data into one or more reconfigurable devices, and reading data output from one or more reconfigurable devices.

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, embodiments of the herein described invention including geometric scene data, object data files, shader descriptors, a rendering engine, output image files, texture maps, and displacement maps. Further embodiments of computer 1200 can include specialized audio and video subsystems for processing and outputting audio and graphics data. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method for testing a set of interface connections in a reconfigurable device between an IP core implementing at least one specialized operation and a set of functional blocks adapted to implement general-purpose logic devices the method comprising:

creating a test program including a set of test data and a test configuration adapted to configure the set of functional blocks to implement a set of boundary scan registers connected with the interface connections of the IP core;

configuring the reconfigurable device according to the test configuration;

inputting the set of test data into the reconfigurable device to create a set of test results; and analyzing the set of test results to determine the integrity of the set of interface connections, wherein when the reconfigurable device is configured in the test configuration, the set of functional blocks are configured to implement the set of boundary scan registers, the set of boundary scan registers including at least one input register, the input register having an input coupled to an output of a multiplexer and an output coupled to a first input of a logic gate, where a select input for the multiplexer is coupled to a second input of the logic gate and an output of the logic gate is coupled to an input of the IP core, wherein the output of the logic gate provides an output signal to an input of the multiplexer, and wherein the output of the input register provides a signal to an input of another input register in the set of boundary scan registers.

2. The method of claim 1, wherein the set of boundary scan registers include a plurality of shift registers connected in series, wherein each shift register is adapted to be connected with an interface connection of the IP core.

3. The method of claim 2, wherein a first portion of the plurality of shift registers is adapted to be connected with a set of input interface connections of the IP core and a second portion of the plurality of shift registers is adapted to be connected with a set of output interface connections of the IP core.

4. The method of claim 1, wherein the test configuration is defined with a hardware description language representation.

5. The method of claim 4, wherein the creating a test program includes:
    combining the hardware description language representation of the test configuration with a hardware description language representation of the IP core to form a test hardware description; and
    analyzing the test hardware description to create a set of test data.

6. The method of claim 5, wherein creating a test program further includes analyzing the test hardware description and the set of test data to create a set of expected test results; and
    wherein analyzing the test results includes comparing the set of test results with the set of expected test results.

7. The method of claim 5, wherein analyzing the test hardware description is performed using automated test program generation software.

8. An information storage medium including a set of instructions therein to cause an information processing device to perform a set of steps, the set of steps comprising:
    creating a test program including a set of test data and a test configuration adapted to configure a set of functional blocks to implement a set of boundary scan registers connected with interface connections of an IP core;
    configuring a reconfigurable device according to the test configuration, the reconfigurable device comprising the functional blocks and IP core;
    inputting the set of test data into the reconfigurable device to create a set of test results; and
    analyzing the set of test results to determine the integrity of the set of interface connections,
    wherein when the reconfigurable device is configured in the test configuration, the set of functional blocks are configured to implement the set of boundary scan registers, the set of boundary scan registers including at least one input register, the input register having an input coupled to an output of a multiplexer and an output coupled to a first input of a logic gate, where a select input for the multiplexer is coupled to a second input of the logic gate and an output of the logic gate is coupled to an input of the IP core, wherein the output of the logic gate provides an output signal to an input of the multiplexer, and wherein the output of the input register provides a signal to an input of another input register in the set of boundary scan registers.

9. The information storage medium of claim 8, wherein the set of boundary scan registers include a plurality of shift registers connected in series, wherein each shift register is adapted to be connected with an interface connection of the IP core.

10. The information storage medium of claim 9, wherein a first portion of the plurality of shift registers is adapted to be connected with a set of input interface connections of the IP core and a second portion of the plurality of shift registers is adapted to be connected with a set of output interface connections of the IP core.

11. The information storage medium of claim 8, wherein the test configuration is defined with a hardware description language representation.

12. The information storage medium of claim 11, wherein the creating a test program includes:
    combining the hardware description language representation of the test configuration with a hardware description language representation of the IP core to form a test hardware description; and
    analyzing the test hardware description to create a set of test data.

13. The information storage medium of claim 12, wherein creating a test program further includes analyzing the test hardware description and the set of test data to create a set of expected test results; and
    wherein analyzing the set of test results includes comparing the set of test results with the set of expected test results.

14. The information storage medium of claim 12, wherein analyzing the test hardware description is performed using automated test program generation software.

15. A reconfigurable device comprising an information storage medium including a test configuration for configuring the reconfigurable device, the reconfigurable device having an IP core implementing at least one specialized operation and a set of functional blocks adapted to implement general-purpose logic devices, the test configuration comprising a configuration of the set of functional blocks implementing a set of boundary scan registers connected with a set of interface connections of the IP core,
    wherein when the reconfigurable device is configured in the test configuration, the set of functional blocks are configured to implement the set of boundary scan registers, the set of boundary scan registers including at least one input register, the input register having an input coupled to an output of a multiplexer and an output coupled to a first input of a logic gate, where a select input for the multiplexer is coupled to a second input of the logic gate and an output of the logic gate is coupled to an input of the IP core, wherein the output of the logic gate provides an output signal to an input of the multiplexer, and wherein the output of the input register provides a signal to an input of another input register in the set of boundary scan registers.

16. The reconfigurable device of claim 15, wherein the set of boundary scan registers include a plurality of shift registers connected in series, wherein each shift register is adapted to be connected with an interface connection of the IP core.

17. The reconfigurable device of claim 16, wherein a first portion of the plurality of shift registers is adapted to be connected with a set of input interface connections of the IP core and a second portion of the plurality of shift registers is adapted to be connected with a set of output interface connections of the IP core.

18. The reconfigurable device of claim 15, wherein the test configuration is defined with a hardware description language representation.

19. The reconfigurable device of claim 15, wherein the information storage medium further includes a set of test data adapted to be input into the IP core via the set of functional blocks implementing the set of boundary scan registers.

20. The reconfigurable device of claim 15, wherein the information storage medium further includes a set of expected test results.

* * * * *